US008368040B2

(12) United States Patent
Loopstra et al.

(10) Patent No.: US 8,368,040 B2
(45) Date of Patent: Feb. 5, 2013

(54) RADIATION SYSTEM AND LITHOGRAPHIC APPARATUS

(75) Inventors: Erik Roelof Loopstra, Eindhoven (NL); Vladimir Vitalevich Ivanov, Moscow (RU); Johannes Hubertus Josephina Moors, Helmond (NL); Gerardus Hubertus Petrus Maria Swinkels, Eindhoven (NL); Andrei Mikhailovich Yakunin, Eindhoven (NL); Dennis De Graaf, Waalre (NL); Uwe Bruno Heini Stamm, Goettingen (DE)

(73) Assignee: ASML Netherlands B.V., Veldhoven (NL)

( * ) Notice: Subject to any disclaimer, the term of this patent is extended or adjusted under 35 U.S.C. 154(b) by 128 days.

(21) Appl. No.: 12/832,258

(22) Filed: Jul. 8, 2010

(65) Prior Publication Data

US 2011/0013166 A1 Jan. 20, 2011

Related U.S. Application Data

(60) Provisional application No. 61/213,745, filed on Jul. 9, 2009, provisional application No. 61/265,010, filed on Nov. 30, 2009, provisional application No. 61/314,910, filed on Mar. 17, 2010.

(51) Int. Cl.
*G21K 5/04* (2006.01)
*H01J 35/20* (2006.01)

(52) U.S. Cl. ............... 250/504 R; 372/5; 372/38.02; 372/50.22; 372/70; 372/76; 372/92; 372/97; 359/347; 359/349; 359/333

(58) Field of Classification Search ............... 250/503.1, 250/504 R, 492.1, 493.1; 372/5, 9, 38.02, 372/50.22, 56, 69, 70, 76, 92; 359/347, 359/349, 333
See application file for complete search history.

(56) References Cited

U.S. PATENT DOCUMENTS

| | | | | |
|---|---|---|---|---|
| 6,973,164 | B2 * | 12/2005 | Hartlove et al. | 378/119 |
| 7,317,196 | B2 * | 1/2008 | Partlo et al. | 250/504 R |
| 7,491,954 | B2 * | 2/2009 | Bykanov et al. | 250/504 R |
| 7,589,337 | B2 * | 9/2009 | Bykanov et al. | 250/504 R |
| 7,903,715 | B2 * | 3/2011 | Nowak et al. | 372/55 |
| 7,916,388 | B2 * | 3/2011 | Bykanov | 359/349 |
| 8,199,398 | B2 * | 6/2012 | Fermann et al. | 359/341.1 |
| 2005/0205811 | A1 * | 9/2005 | Partlo et al. | 250/504 R |
| 2009/0161201 | A1 * | 6/2009 | Ershov et al. | 359/333 |
| 2010/0193710 | A1 * | 8/2010 | Wakabayashi et al. | 250/504 R |
| 2011/0058588 | A1 * | 3/2011 | Ershov et al. | 372/55 |
| 2012/0235066 | A1 * | 9/2012 | Ershov | 250/504 R |

* cited by examiner

*Primary Examiner* — Bernard E Souw
(74) *Attorney, Agent, or Firm* — Pillsbury Winthrop Shaw Pittman LLP (57) ABSTRACT

A radiation system includes a target material supply configured to supply droplets of target material along a trajectory, and a laser system that includes an amplifier and optics. The optics are configured to establish a first beam path which passes through the amplifier and through a first location on the trajectory, and to establish a second beam path which passes through the amplifier and through a second location on the trajectory. The laser system is configured to generate a first pulse of laser radiation when photons emitted from the amplifier are reflected along the first beam path by a droplet of target material at the first location on the trajectory. The laser system is configured to generate a second pulse of laser radiation when photons emitted from the amplifier are reflected along the second beam path by the droplet of target material at the second location on the trajectory.

12 Claims, 7 Drawing Sheets

RADIATION SYSTEM AND LITHOGRAPHIC APPARATUS

CROSS-REFERENCE TO RELATED APPLICATIONS

This application claims the benefit of priority from U.S. Provisional Patent Application Ser. Nos. 61/213,745, filed Jul. 9, 2009, 61/265,010, filed Nov. 30, 2009, and 61/314,910, filed Mar. 17, 2010, the entire contents of all of which are incorporated herein by reference.

FIELD

The present invention relates to a radiation system and to a lithographic apparatus comprising a radiation system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways (either separately or in combination): by shortening the exposure wavelength $\lambda$, by increasing the numerical aperture $NA_{PS}$, or by decreasing the value of $k_1$.

In order to shorten the exposure wavelength and, thus, reduce the minimum printable size, it has been proposed to use an extreme ultraviolet (EUV) radiation system. EUV radiation systems are configured to output a radiation wavelength of about 13 nm. Thus, EUV radiation systems may constitute a significant step toward achieving small features printing. Such radiation is termed extreme ultraviolet or soft x-ray, and possible systems include, for example, laser-produced plasma sources, discharge-produced plasma sources, or synchrotron radiation from electron storage rings.

A laser-produced plasma source, when in operation, converts a material into a plasma state that has an element, e.g. Xe, Li or Sn with emission lines in the EUV range. The desired plasma can be produced by irradiating a target material, for example in the form of a droplet, stream or cluster of material, with a laser beam.

For this process, the plasma is typically produced in a sealed vessel, e.g., vacuum chamber, which may be referred to as plasma chamber, and monitored using various types of metrology equipment. In addition to generating EUV radiation, these plasma processes also typically generate undesirable by-products in the plasma chamber which can include out-of-band radiation, high energy ions and debris, e.g., atoms and/or clumps/microdroplets of the target material.

These plasma formation by-products can potentially heat, damage or reduce the operational efficiency of the various plasma chamber optical elements including, but not limited to, collector mirrors including multi-layer mirrors (MLM's) capable of EUV reflection at normal incidence and/or grazing incidence, the surfaces of metrology detectors, windows used to image the plasma formation process, and the laser input window. The heat, high energy ions and/or debris may be damaging to the optical elements in a number of ways, including coating them with materials which reduce radiation transmission, penetrating into them and possibly damaging structural integrity and/or optical properties, such as the ability of a mirror to reflect radiation at such short wavelengths, corroding or eroding them and/or diffusing into them. For some target materials, e.g., tin, it may be desirable to introduce an etchant such as a halogenide (e.g. HCl, HI or HBr) into the plasma chamber. The etchant etches away material such as debris that has been deposited on the optical elements.

As indicated above, one technique to produce EUV radiation involves irradiating a target material. In this regard, $CO_2$ lasers, e.g., outputting radiation at 10.6 μm wavelength, may present certain advantages as a laser irradiating the target material in a laser-produced plasma (LPP) process. This may be especially true for certain target materials, e.g., materials containing tin. For example, one potential advantage may include the ability to produce a relatively high conversion efficiency between the laser input power and the output EUV power. Another potential advantage of $CO_2$ drive lasers may include the ability of the relatively long wavelength radiation (for example, as compared to deep UV at 198 nm) to reflect from relatively rough surfaces such as a reflective optic that has been coated with tin debris. This property of 10.6 μm radiation may allow reflective mirrors to be employed near the plasma for, for example, steering, focusing and/or adjusting the focal power of the drive laser beam. For 10.6 μm drive lasers, the window inputting the laser into the plasma chamber is typically made of ZnSe and coated with an anti-reflection coating. Unfortunately, these materials may be sensitive to certain etchants, e.g., halogenides.

In addition to the challenges presented by plasma generated debris, it can be difficult to consistently and accurately hit a series of moving droplets with a pulsed laser beam. For example, some high-volume EUV radiation sources may require the irradiation of droplets having a diameter of about 20-50 μm and moving at a velocity of about 50-100 m/s.

With the above in mind, systems and methods have been proposed for effectively delivering and focusing a laser beam to a selected location in an EUV radiation source.

U.S. Pat. No. 7,491,954 describes an EUV radiation source which comprises an optical gain medium and a lens which is arranged to direct radiation generated by the optical gain medium onto a droplet of fuel material. The optical gain medium and lens are arranged such that the optical gain medium generates laser radiation when the droplet of fuel material is at a predetermined location, thereby causing the droplet of fuel material to produce an EUV radiation emitting plasma. Since optical gain medium is triggered by the presence of the droplet of fuel material at the predetermined location, a seed laser is not required to trigger operation of the optical gain medium.

SUMMARY

It may be desirable to increase conversion efficiency of the EUV radiation-emitting plasma.

According to an aspect of the invention, there is provided a radiation system comprising a target material supply configured to supply droplets of target material which may be formed from Xe, Li or Sn along a trajectory, and a laser system comprising an amplifier and optics, wherein the optics are configured to establish a first beam path which passes through the amplifier and through a first location on the trajectory, and to establish a second beam path which passes through the amplifier and through a second location on the trajectory, the laser system, such as a $CO_2$ laser, being configured to generate a first pulse of laser radiation when photons emitted from the amplifier are reflected along the first beam path by a droplet of target material at the first location on the trajectory, and the laser system being further configured to generate a second pulse of laser radiation when photons emitted from the amplifier are reflected along the second beam path by the droplet of target material at the second location on the trajectory.

The radiation system may further include a collector mirror to collect and focus EUV radiation generated by a plasma formed from the droplet of target material. The laser radiation may for instance have a wavelength of between about 9 μm and about 11 μm. The laser radiation may for instance have a wavelength of between about 9 μm and about 11 μm. The diameter of the first aperture may be less than the diameter of the second aperture. The first beam path may pass through the center of one or more amplifier chambers which comprise the amplifier. The second beam path optionally does not pass through the center of one or more amplifier chambers which comprise the amplifier. The amplifier may include a plurality of amplifier chambers. A cavity mirror may be provided at one end of the first beam path and the same cavity mirror may be provided at one end of the second beam path.

According to an aspect of the invention, there is provided a lithographic apparatus comprising a radiation system comprising a target material supply configured to supply droplets of target material along a trajectory, and a laser system comprising an amplifier and optics, wherein the optics are configured to establish a first beam path which passes through the amplifier and through a first location on the trajectory, and to establish a second beam path which passes through the amplifier and through a second location on the trajectory, the laser system being configured to generate a first pulse of laser radiation when photons emitted from the amplifier are reflected along the first beam path by a droplet of target material at the first location on the trajectory, and the laser system being further configured to generate a second pulse of laser radiation when photons emitted from the amplifier are reflected along the second beam path by the droplet of target material at the second location on the trajectory. The lithographic apparatus includes an illumination system configured to condition EUV radiation emitted by the radiation system, a support structure constructed to hold a patterning device, the patterning device being configured to impart the radiation beam with a pattern in its cross-section to form a patterned radiation beam, a substrate table constructed to hold a substrate, and a projection system configured to project the patterned radiation beam onto a target portion of the substrate.

According to an aspect of the invention, there is provided a method for generating an EUV radiation beam, comprising supplying a droplet of a target material along a trajectory, the trajectory extending through a preconditioning position and a plasma formation position, generating a first pulse of laser radiation from a laser system when photons emitted from an amplifier of the laser system are reflected by the droplet of target material at the preconditioning position, the first pulse of laser radiation being incident upon the droplet of target material and causing heating of the droplet of target material, and generating a second pulse of laser radiation from the laser system when photons emitted from the amplifier of the laser system are reflected by the droplet of target material at the plasma formation position, the second pulse of laser radiation being incident upon the droplet of target material and causing it form an EUV radiation emitting plasma.

According to an aspect of the invention, there is provided a radiation system that includes a target material supply configured to supply droplets of target material along a trajectory, a secondary radiation beam generator configured to generate a secondary radiation beam directed to a first location on the trajectory, a primary radiation beam generator configured to generate a primary radiation beam directed to a second location on the trajectory, and a collector mirror configured to collect and redirect radiation generated at the second location to an intermediate focus. Debris generated at the first location is redirected by the collector mirror to a third location that is spaced from the intermediate focus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
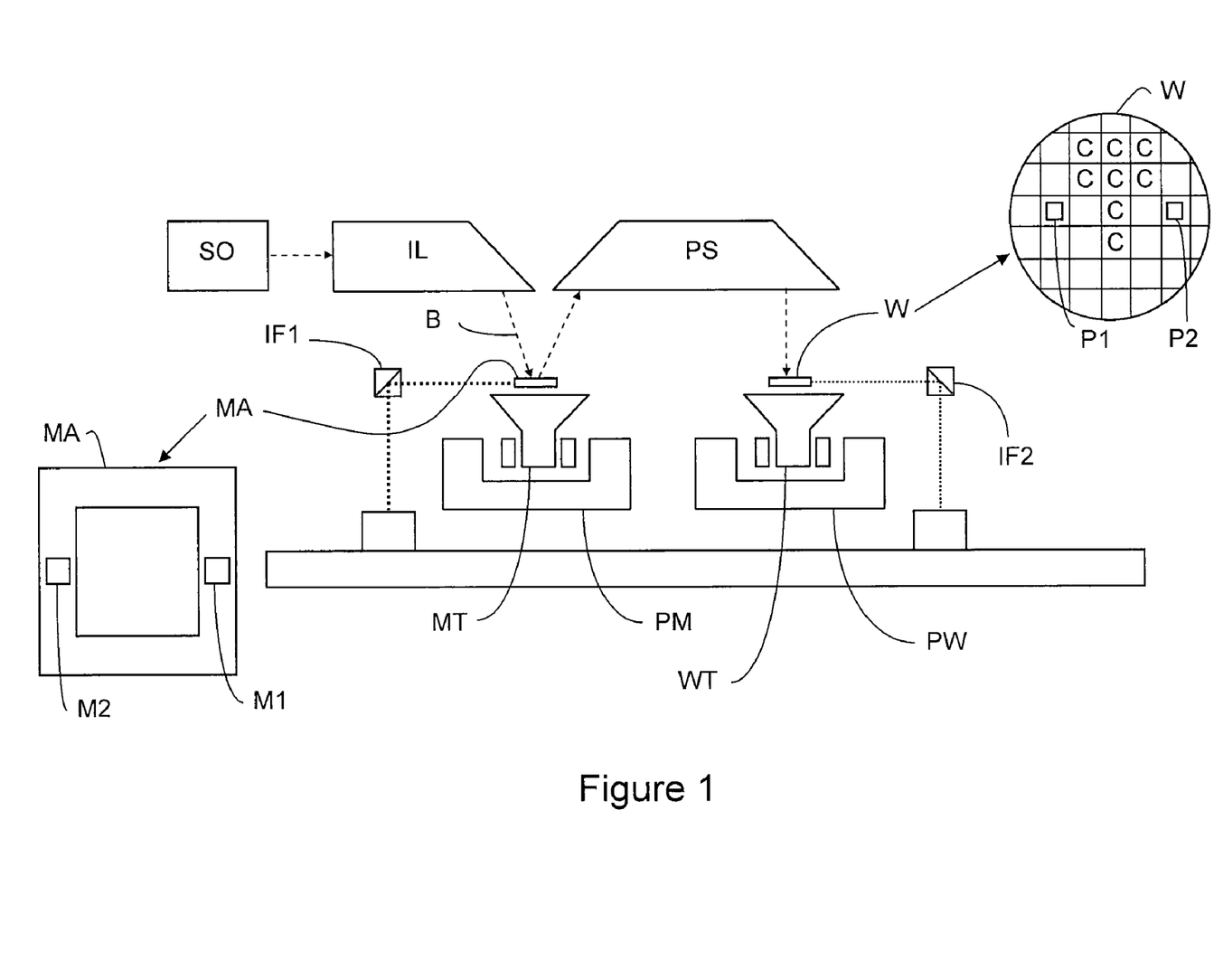
FIG. 1 depicts a lithographic apparatus according to an embodiment of the invention.

FIG. 1 schematically depicts a lithographic apparatus according to an embodiment of the invention. The apparatus comprises an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source may be an integral part of the lithographic apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can, be readily applied to maskless lithography that utilizes programmable patterning device, such as a programmable mirror array of a type as referred to above.

Combinations and/or variations on the above described modes of use or entirely different modes of use may also be employed.

Figure 2:
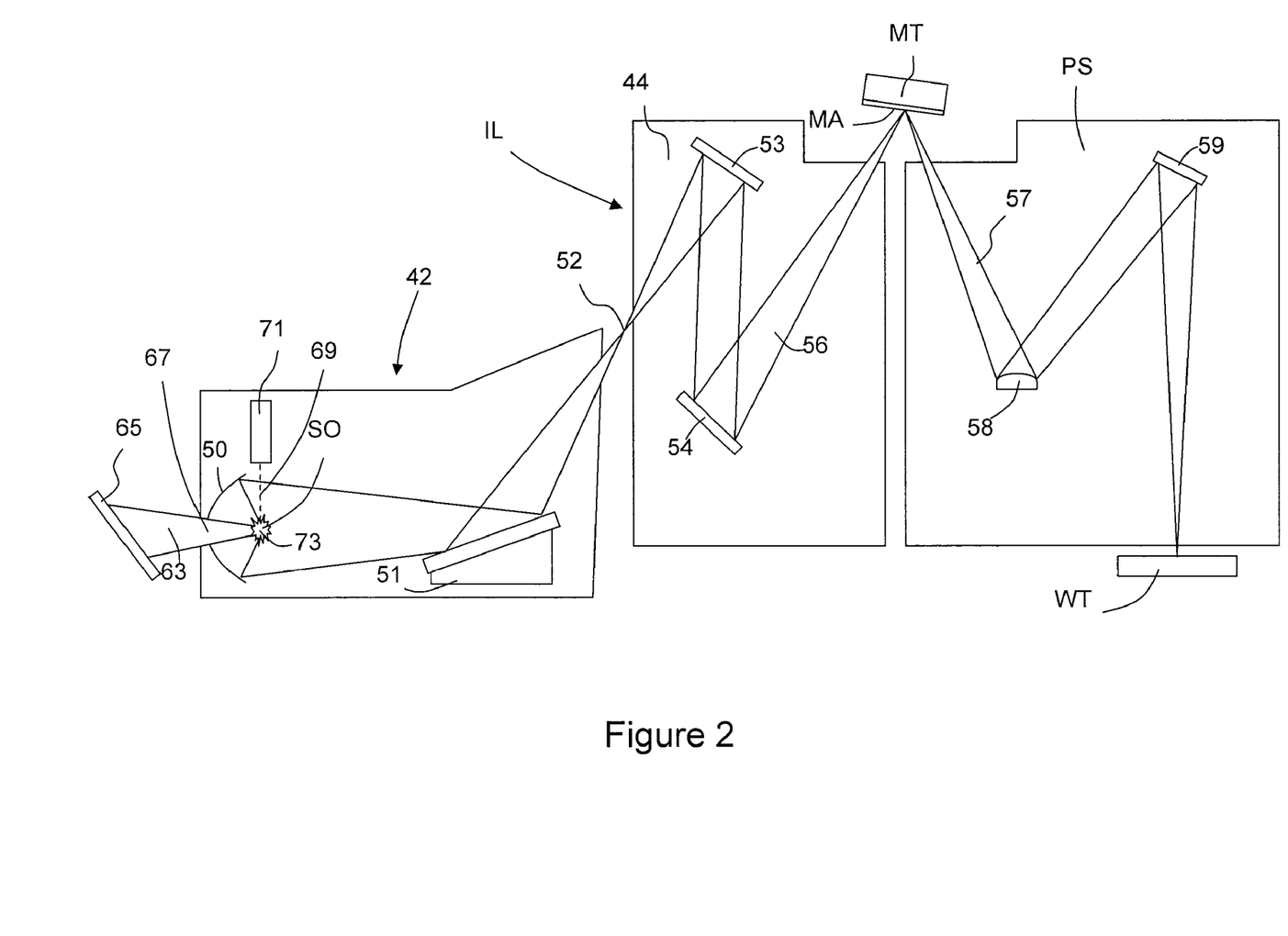
FIG. 2 depicts a more detailed schematic view of the lithographic apparatus of FIG. 1.

FIG. 2 shows the lithographic apparatus of FIG. 1 in more detail, including a radiation system 42, the illumination system IL, and the projection system PS. EUV radiation may be produced by creating a plasma which is very hot and which emits radiation in the EUV range of the electromagnetic spectrum. The plasma may be created by laser-irradiation of a droplet of target material provided by a target material supply 71. Droplets of target material may for example be Xe, Li or Sn, and may be ejected along a trajectory 69 by the target material supply. The droplets of target material may for example have a diameter of about 20-50 μm, and may for example have a velocity of about 50-100 m/s. In an embodiment, the droplets of the target material may have a velocity between about 10 m/s and about 10000 m/s.

Radiation emitted by the plasma is reflected by a collector mirror 50 which is configured to focus the radiation to a focal point, which in this embodiment coincides with a so-called intermediate focus 52. In this embodiment, the radiation is focused to the focal point via a grazing incidence mirror 51. In other embodiments the grazing incidence mirror 51 may be omitted. The radiation system 42 may further comprise a contaminant barrier (not shown in the Figures). The contaminant barrier may comprise a gas barrier or a combination of a gas barrier and a channel structure.

From the radiation system 42, a beam of radiation 56 is reflected in the illumination system IL via mirrors 53, 54 onto a patterning device MA (e.g., a reticle or mask) positioned on patterning device support MT (e.g., a reticle or mask table). A patterned beam 57 is formed which is imaged in projection system PS via reflective elements 58, 59 onto the substrate table WT. More elements than shown may be present in the illumination system IL and the projection system PS.

The grazing incidence mirror 51 may be a grating spectral filter. Instead of or in addition to the grating spectral filter, a transmissive optical filter may be present in the lithographic apparatus that is transmissive for EUV and less transmissive of radiation at other wavelengths (or even substantially absorbing of radiation at other wavelengths).

The collector mirror 50 may be a normal-incidence mirror, as shown in FIG. 2, or may have some other form. The collector mirror 50 may comprise Si/Mo multi-layers.

The radiation system 42 is provided with a laser system (described further below) which is constructed and arranged to provide a laser radiation beam 63 that is reflected by a steering mirror 65 through an opening 67 provided in the collector mirror 50. The laser system may be a pulsed laser system. The steering mirror 65 is arranged to direct a beam path of the laser radiation beam 63 through the plasma formation position 73.

In operation, droplets of target material are supplied along the trajectory 69 by the target material supply 71. When a droplet of target material reaches the plasma formation position 73, the laser radiation beam 63 impinges on the droplet and an EUV radiation-emitting plasma is formed. EUV radiation emitted from the plasma is focused by the normal-incidence collector mirror 50 and passes via the reflective spectral grating filter 51 to the intermediate focus point 52.

Figure 3:
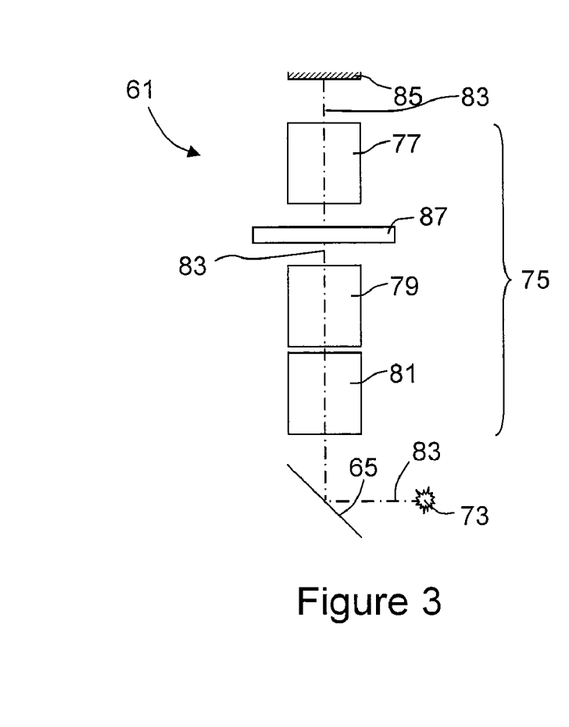
FIG. 3 depicts a schematic view of a radiation source according to an embodiment of the invention.

FIG. 3 schematically depicts the laser system 61 which generates the laser radiation 63 shown in FIG. 2. The laser system 61 of FIG. 3 comprises an amplifier 75 having three amplifier chambers 77, 79 and 81. The amplifier chambers 77, 79 and 81 may each comprise an optical gain medium positioned along a beam path 83. The laser system 61 further comprises a cavity mirror 85 constructed and arranged to reflect radiation incident on the cavity mirror 85 from a position on the beam path 83 back in the opposite direction. The cavity mirror 85 may for example be a flat mirror, a curved mirror, a phase-conjugate mirror or a corner reflector. Optics 87, which are described further below, are provided between the first amplifier chamber 77 and the second amplifier chamber 79. The steering mirror 65 directs the beam path 83 through the plasma formation position 73.

When a droplet of target material reaches the plasma formation position 73, spontaneously emitted photons from optical gain media in the amplifier chambers 77, 79 and 81 may be scattered by the droplet. Some of these scattered photons may lie on the beam path 83, such that they are directed into the amplifier 75 by the steering mirror 65. These photons are amplified by the amplifier 75, are reflected from the cavity mirror 85, and are then amplified again by the amplifier 75, thereby producing a laser radiation beam. As shown in FIG. 2, the laser radiation beam 63 is incident upon the droplet of target material, thereby causing the target material to vaporize and produce an EUV radiation-emitting plasma.

The laser beam may have a wavelength between about 9 μm and about 11 μm. A wavelength of about 10.6 μm may be used, since radiation of that wavelength has proven to be particularly effective in producing an EUV radiation-emitting plasma. The optical gain media of the amplifier chambers 77, 79 and 81 may for example comprise a mixture of helium gas, nitrogen gas and $CO_2$ gas, or any other suitable combination of gases.

Figure 4:
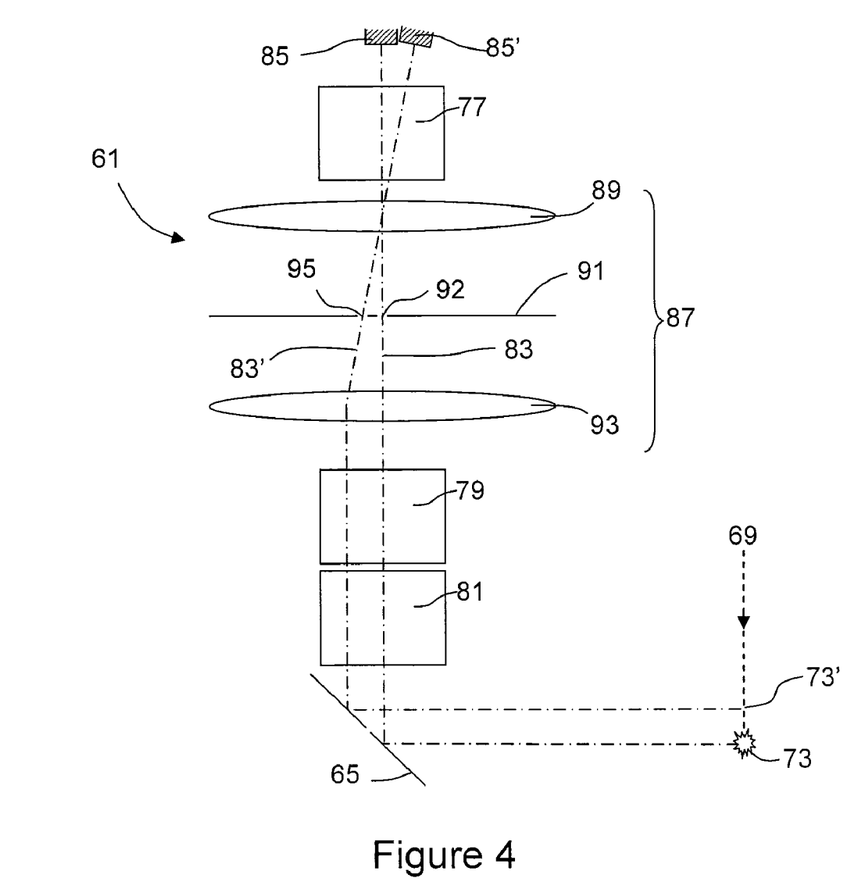
FIG. 4 depicts the radiation source of FIG. 3 in more detail.

FIG. 4 depicts the laser system 61 again, but shows it in more detail, including the optics 87. The optics 87 comprises an upstream lens 89, an aperture plate 91 having a first aperture 92 and a second aperture 95, and a downstream lens 93. The lenses 89, 93 are focusing lenses which focus laser radiation through the apertures 92, 95 in the aperture plate 91. The lenses 89, 93 together with the apertures 92, 95 may be considered to form a spatial filter. The lenses 89, 93 shown in FIG. 4 may be replaced by other suitable optics, for example curved mirrors.

Figure 5:
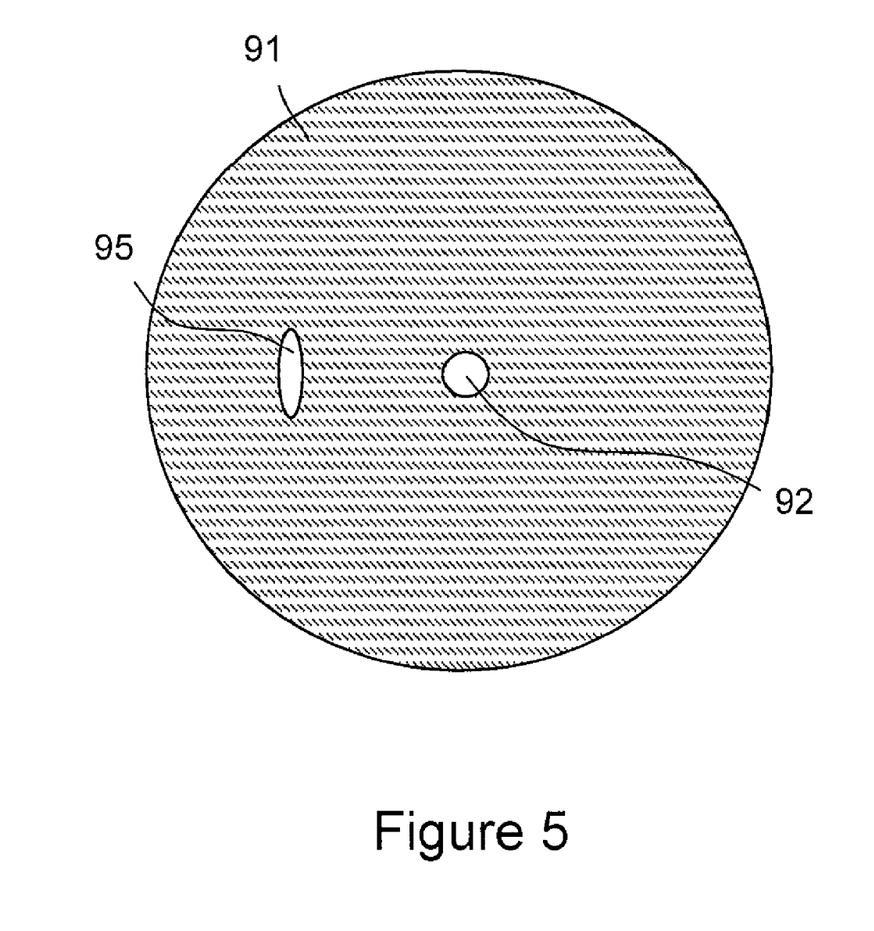
FIG. 5 depicts an aperture plate of the radiation source of FIGS. 3 and 4.

FIG. 5 shows the aperture plate 91 viewed from one side. It can be seen from FIG. 5 that the aperture plate 91 is a disk of opaque material in which the first aperture 92 is a circular opening and the second aperture 95 is an elliptical opening. The optics 87 restrict oscillation of the laser system to specific beam paths.

The first aperture 92 defines a beam path 83 along which laser oscillation of the laser system 61 may occur. This beam path 83 intersects with the plasma formation position 73. The beam path 83 also passes through the center of each amplifier chamber 77, 79, 81. This allows gain media in the amplifier chambers 77, 79, 81 to deliver gain to radiation traveling along the beam path, and thereby provide laser radiation having a high intensity.

The second aperture 95 defines a beam path 83' along which laser oscillation of the laser system 61 may occur. The beam path 83' does not intersect with the plasma formation position 73, but instead intersects with a preconditioning position 73', where a droplet of target material is preconditioned (as described further below). The preconditioning position 73' is located upstream on the trajectory 69 of the droplet of target material with respect to the plasma formation position 73. For ease of illustration, only part of the trajectory 69 is shown in FIG. 4.

The laser system further comprises a second cavity mirror 85'. The second cavity mirror 85' is constructed and arranged to reflect back in the opposite direction radiation which is incident upon the second cavity mirror from the beam path 83'. The second cavity mirror 85' may for example be a flat mirror, a curved mirror, a phase-conjugate mirror or a corner reflector.

In an alternative arrangement (not shown) a single cavity mirror may be used to reflect radiation on the beam path 83 and to reflect radiation on the beam path 83'.

The steering mirror 65 is constructed and arranged to direct the radiation on the beam path 83' towards the preconditioning position 73'. In an alternative arrangement (not shown) separate mirrors maybe used to direct radiation towards the plasma formation position 73 and to direct radiation towards the preconditioning position 73'.

The beam path 83' passes through the amplifier chambers 77, 79, 81, although in this example not through the center of gain media of the amplifier chambers. The gain media in the amplifier chambers 77, 79, 81 deliver gain to radiation traveling along the beam path 83', and thereby provide laser radiation. The laser radiation has a lower intensity than the laser radiation which travels along the beam path 83 to the plasma formation position 73.

In use, droplets of the target material, for example Xe, Li or Sn, are emitted along the trajectory 69 by the target material supply 71 (see FIG. 2). When a droplet of target material reaches the preconditioning position 73', photons which have been spontaneously emitted by the amplifier chambers 77, 79, 81 are reflected by the droplet of target material along the beam path 83'. These photons are amplified by the gain media in the amplifier chambers 77, 79, 81, thereby leading to generation of a pulse of laser radiation (referred to hereafter as the initial pulse of laser radiation). The droplet of target material may be considered to form one end of a laser cavity, with the opposite end being formed by the second cavity mirror 85', thereby causing laser oscillation to occur.

The initial pulse of laser radiation is incident upon the droplet of target material at the preconditioning position 73', and causes heating of the droplet of target material. This heating of the droplet of target material will cause the droplet of target material to expand, and in some instances may generate a partial plasma.

The droplet of target material continues to travel along the trajectory 69, and reaches the plasma formation position 73. When this occurs, photons which have been spontaneously emitted by the amplifier chambers 77, 79, 81 are reflected by the droplet of target material along the beam path 83. These photons are amplified by the gain media in the amplifier chambers 77, 79, 81, thereby leading to generation of a pulse of laser radiation (referred to hereafter as the main pulse of laser radiation). The droplet of target material may be considered to form one end of a laser cavity, with the opposite end being formed by the cavity mirror 85, thereby causing laser oscillation to occur.

The main pulse of laser radiation is incident upon the droplet of target material at the plasma formation position 73, and causes the droplet of target material to vaporize and form an EUV emitting plasma.

Preconditioning the droplet of target material using the initial pulse of laser radiation at the preconditioning position 73' may improve the efficiency with which the droplet of target material is converted to the BIN emitting plasma. This may occur because the droplet of target material is expanded in size and/or converted into a partial plasma by the initial pulse of laser radiation at the preconditioning position 73', thereby allowing laser radiation to be coupled into the droplet of target material more efficiently at the plasma formation position 73. The improved efficiency of plasma generation may be advantageous because it increases the intensity of EUV radiation which may be provided by the radiation system, without having to increase the power of the laser system 61. This allows the throughput of lithographic apparatus which uses the EUV radiation to be improved. Another potential advantage is that the same intensity of EUV radiation may be achieved using a laser system 61 which has a lower power than the laser system used by a prior art EUV radiation source.

Furthermore, since the conversion efficiency has been improved, the amount of contamination which is generated from the droplet of target material may be reduced (where contamination may include fast ions, atoms and/or clumps/microdroplets of the target material).

The time which elapses while the droplet of target material travels from the preconditioning position 73' to the plasma formation position 73 may not be sufficiently long for the amplifiers 77, 79, 81 to fully regain energy which was depleted when the initial pulse of radiation was generated. Thus, the energy of the main pulse of laser radiation may be less than would be the case if the initial pulse of laser radiation had not been generated. Nevertheless, the preconditioning of the droplet of target material which is provided by the initial pulse of laser radiation allows the generation of more EUV than would have been the case if the initial pulse of laser radiation had not been generated.

The diameter of the second aperture 95 in the aperture plate 91 is less than the diameter of the first aperture 92 (where the diameter is measured in a direction which corresponds to the trajectory of the droplets of target material). Consequently, the droplet of target material forms a laser cavity with the second cavity mirror 85' for a shorter period of time, and the droplet of target material forms a laser cavity with the cavity mirror 85 for a longer period of time. This may assist in providing the initial pulse of laser radiation with a lower intensity, and providing the main pulse of laser radiation with a higher intensity.

Although the first aperture 92 is shown as a circle and the second aperture 95 is shown as an oval, the apertures may have any suitable shape. Appropriate sizes, shapes and positions for the apertures 92, 95 may be determined experimentally. The second aperture 95 may for example have an elongate shape (e.g. an oval as shown in FIG. 5). Where this is the case, the second aperture may be longer in a direction which is transverse to the direction of motion of the droplet of target material, and shorter in a direction which is parallel to the direction of motion of the droplet of target material. This may allow optics of the laser system 61 to be optimized for the first aperture 92, since the elongate shape of the second aperture 95 allows some misalignment of the optics in relation to the second aperture while still ensuring that the initial pulse of laser radiation may be triggered by the droplet of target material.

The position of the second aperture 95 may be selected such that a droplet of target material has sufficient time to expand in size and/or be converted into a partial plasma before the droplet reaches the first aperture 92 (taking into account the velocity of the droplet of target material).

The aperture plate 91 may be arranged such that it does not reflect radiation in a manner which would cause an unwanted laser cavity to be formed between the aperture plate 91 and one of the cavity mirrors 85, 85'. The apertures 92, 95 may have smooth edges. Having smooth edged apertures (rather than sharp edged apertures) may reduce the risk that edge diffraction and scattering occurs at edges of the apertures. This reduces the risk that a laser cavity is formed between the aperture plate 91 and one of the cavity mirrors 85, 85'. The aperture plate 91 may for example be formed from molybdenum. Molybdenum does not reflect radiation at 10.6 fun, and may therefore reduce the risk that a laser cavity is formed between the aperture plate 91 and one of the cavity mirrors 85, 85'.

Although the illustrated aperture plate 91 is a disk, the aperture plate may have any suitable shape. Each aperture 92, 95 may be provided in a different aperture plate.

The optics 87 restrict formation of a laser cavity between the droplet of target material and the cavity mirrors 85, 85', allowing the laser cavity to form only when the droplet of target material is at the preconditioning position 73' or at the plasma formation position 73. Consequently, the laser system 61 only generates laser radiation when the droplet of target material is at the preconditioning position 73' or at the plasma formation position 73.

Although the optics 87 shown in FIGS. 4 and 5 comprise an aperture plate 91 with two apertures 92, 95 together with lenses 89, 93, the optics may take other forms. One or more of the lenses may 89, 93 may be replaced by curved mirrors.

Additional lenses and/or apertures may be used. One or more additional apertures and associated lenses may be used for example to restrict or prevent the laser system from generating laser radiation at unwanted wavelengths.

In FIGS. 3 and 4, the optics 87 are between a first amplifier chamber 77 and a second amplifier chamber 79. However, the optics 87 may be provided at other locations. For example, the optics 87 may be provided between the first amplifier chamber 77 and the cavity mirrors 85, 85'. The optics 87 may be provided between the second amplifier chamber 79 and the third amplifier chamber 81. The optics 87 may be provided after the third amplifier chamber 81 (although in some instances this may limit the diameter of the laser radiation beam). Since the amplifier chambers 77, 79, 81 act to amplify laser radiation generated by the laser system 61, the intensity of laser radiation is lowest adjacent to the cavity mirrors 85, 85 and increases as the laser radiation passes through each amplifier chamber 77, 79, 81. Taking this into account, the position of the optics 87 may be chosen such that the intensity of radiation incident upon the optics does not damage the optics (e.g. by positioning the optics between the first and second amplifier chambers 77, 79).

Referring to FIG. 2, the opening 67 provided in the collector mirror 50 may be sufficiently large to accommodate the beam path 83 and the beam path 83'. In an alternative arrangement, the collector mirror 50 may be provided with a first opening which accommodates the beam path 83 and a second opening which accommodates the beam path 83'.

In the described embodiment, the beam path 83 passes through the center of the amplifier chambers 77, 79, 81, and the beam path 83' does not pass through the center of the amplifier chambers. However, the beam paths may take any route through the amplifier chambers. The beam path 83' may, for example, pass through only some of the amplifier chambers.

In the described embodiment, the steering mirror 65 is used to direct the beam path 83 towards the plasma formation position 73, and to direct the beam path 83' towards the preconditioning position 73'. The steering mirror 65 may be planar or curved, for example including optical power such that the laser radiation is focussed onto the droplet of target material. Other optics may be used in addition to, or instead of, the steering mirror 65 to direct the beam paths towards the plasma formation and preconditioning positions 73, 73' (and to focus the laser radiation). In an embodiment, the steering mirror 65 may be omitted such that the beam paths pass directly from the amplifier chambers 77, 79, 81 to the plasma formation and preconditioning positions 73, 73'. Where this is the case, the steering mirror may be replaced with focussing optics (e.g. a convex lens) arranged to focus the laser radiation onto the droplet of target material.

Figure 6:
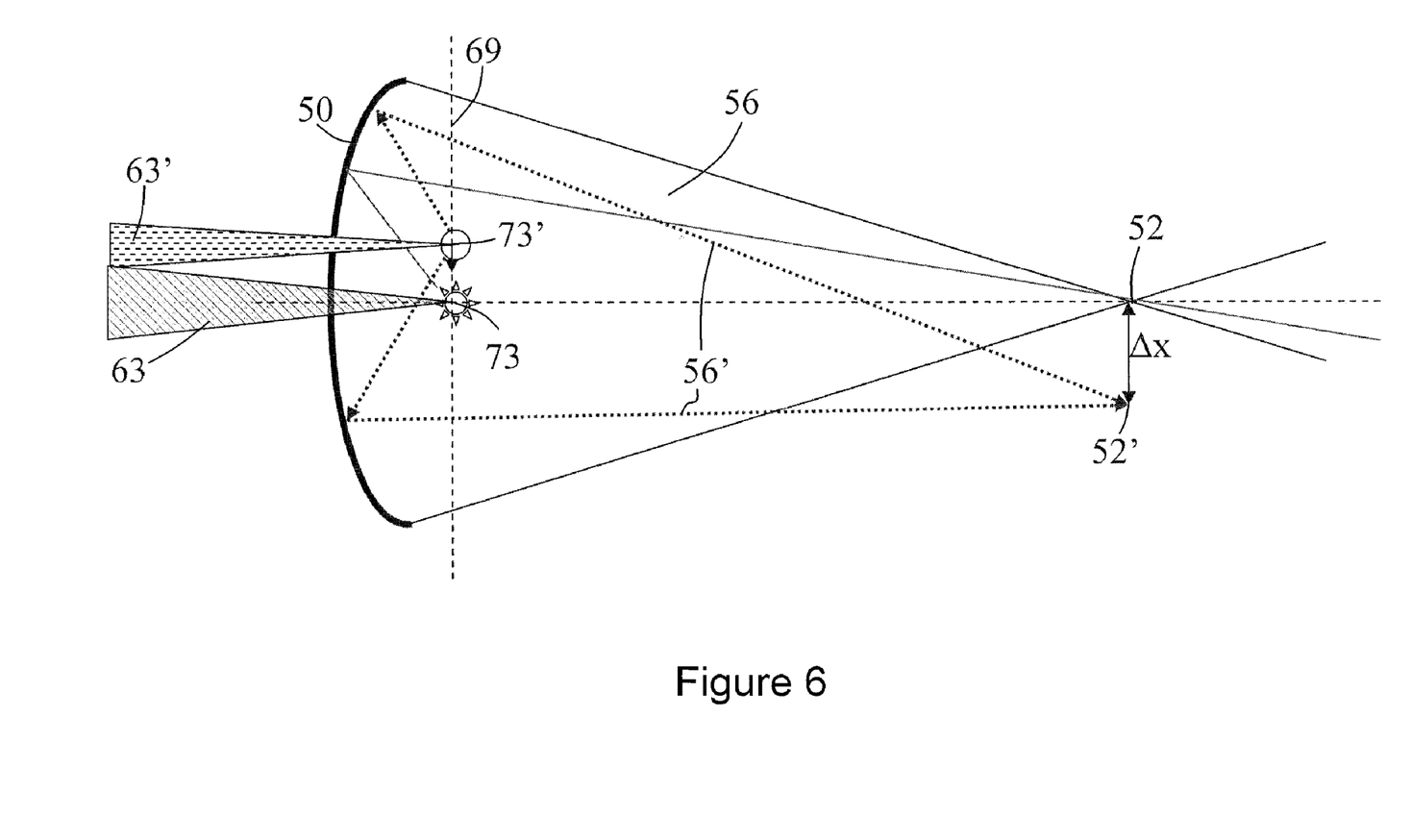
FIG. 6 depicts a schematic view of a radiation source according to an embodiment of the invention.

FIG. 6 illustrates an embodiment of a radiation source that includes a secondary radiation beam 63' that may be generated by a secondary radiation beam generator, such as a laser, and a primary radiation beam 63 that may be generated by a primary radiation beam generator, such as a laser. The secondary radiation beam generator is configured to direct the secondary radiation beam 63' so that the secondary radiation beam 63' hits a droplet of target material at the preconditioning position 73'. The primary radiation beam generator is configured to direct the primary radiation beam 63 so that the primary radiation beam 63 hits a droplet of target material at the plasma formation position 73, which is located at the primary focus of the collector mirror 50. From the preconditioning position 73', debris may be emitted along debris propagation paths 56'. As indicated in FIG. 6, the debris propagation paths 56' intersect at a location 52', which is displaced by a distance $\Delta x$ from the intermediate focus point 52. The magnitude of $\Delta x$ depends on the distance between the plasma formation position 73 and the preconditioning position 73'. Due to this effect, a significant portion of the debris may be re-directed away from the radiation beam 56 and the intermediate focus point 52.

Figure 7:
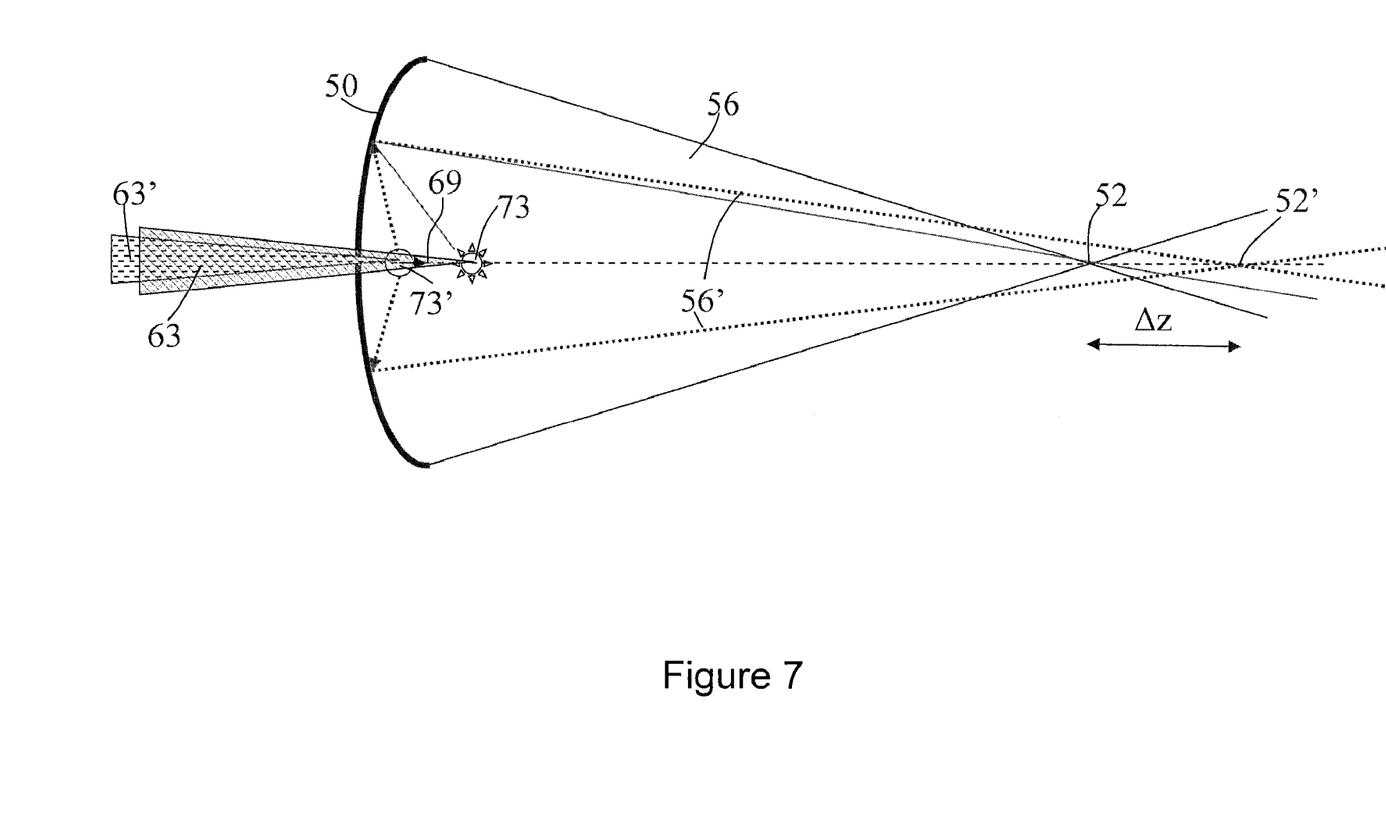
FIG. 7 depicts a schematic view of a radiation source according to an embodiment of the invention.
Figure 8:
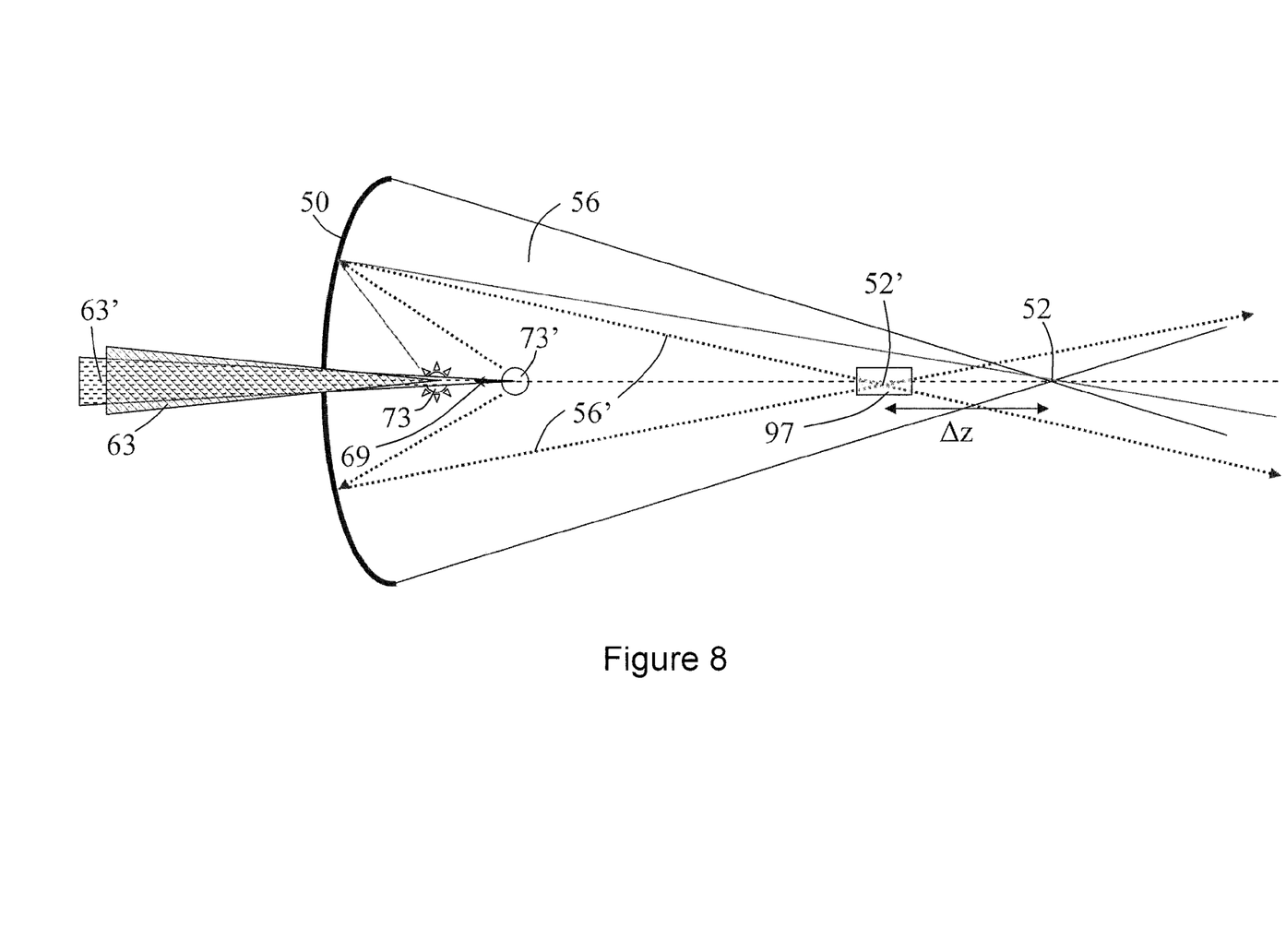
FIG. 8 depicts a schematic view of a radiation source according to an embodiment of the invention.

FIGS. 7 and 8 disclose additional embodiments of the radiation source of FIG. 6. In both FIGS. 7 and 8, the trajectory 69 is oriented perpendicularly with respect to the collector mirror 50. Because target droplet velocity can be as high as 1000 m/s or even 10000 m/s, and the relevant distances are relatively small, any influence of gravitation acceleration may be negligible. In the embodiment of FIG. 7, the preconditioning position 73' is between the plasma formation position 73 and the collector mirror 50, which causes the debris propagation paths 56' to intersect at a location 52' that is displaced by a distance $\Delta z$ further downstream from the intermediate focus point 52 relative to the propagation direction of the radiation 56.

In the embodiment of FIG. 8, the preconditioning position 73' is between the plasma formation position 73 and the intermediate focus point 52, which causes the debris propagation paths 56' to intersect at a location 52' $\Delta z$ upstream from the intermediate focus point 52 relative to the propagation direction of the radiation 56. A illustrated, a droplet debris catch 97 may be positioned to catch debris at the location 52'.

In order to apply the principles of this effect, the radiation hitting the droplet of target material at the preconditioning position 73' desirably has a total energy of about 1 mJ to about 1000 mJ and has an interaction time with the droplet of about 0.1 ns to about 100 ns. The wavelength of the radiation hitting the droplet of target material may be, for example, about 10.6 μm. Other wavelengths, for example, between about 0.1 μm and about 20 μm may also be suitable.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Where the context allows, terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the scope of the claims set out below.

What is claimed is:
1. A radiation system comprising:
a target material supply configured to supply droplets of target material along a trajectory; and
a laser system comprising an amplifier and optics, the optics being configured to establish a first beam path which passes through the amplifier and through a preconditioning position on the trajectory at which the droplets of target material are heated, and to establish a second beam path which passes through the amplifier and through a plasma formation position on the trajectory at which the droplets of target material form an EUV radiation emitting plasma, the laser system being configured to generate a first pulse of laser radiation when photons emitted from the amplifier are reflected along the first beam path by a droplet of target material at the preconditioning position on the trajectory, and to generate a second pulse of laser radiation when photons emitted from the amplifier are reflected along the second beam path by the droplet of target material at the plasma formation position on the trajectory.

2. The radiation system of claim 1, wherein the optics comprises a spatial filter provided with a first aperture through which the first beam path passes, and a second aperture through which the second beam path passes.

3. The radiation system of claim 1, wherein a first cavity mirror is provided at one end of the first beam path, and a second cavity mirror is provided at one end of the second beam path.

4. The radiation system of claim 1, wherein the radiation system further comprises one or more steering optics configured to direct the first beam path towards the preconditioning position on the trajectory of the target material droplets, and configured to direct the second beam path towards the plasma formation position on the trajectory of the target material droplets.

5. The radiation system of claim 1, wherein the intensity of the second pulse of laser radiation is greater than the intensity of the first pulse of laser radiation.

6. The radiation system of claim 1, wherein the amplifier comprises a plurality of amplifier chambers and wherein the optics are provided between adjacent amplifier chambers.

7. The radiation system of claim 1, wherein the preconditioning position on the trajectory is closer to the target material supply than the plasma formation position on the trajectory.

8. A method for generating an EUV radiation beam, comprising:
supplying a droplet of a target material along a trajectory, the trajectory extending through a preconditioning position and a plasma formation position;
generating a first pulse of laser radiation from a laser system when photons emitted from an amplifier of the laser system are reflected by the droplet of target material at the preconditioning position, the first pulse of laser radiation being incident upon the droplet of target material and causing heating of the droplet of target material; and
generating a second pulse of laser radiation from the laser system when photons emitted from the amplifier of the laser system are reflected by the droplet of target material at the plasma formation position, the second pulse of laser radiation being incident upon the droplet of target material and causing it form an EUV radiation emitting plasma.

9. The method of claim 8, wherein the intensity of the second pulse of laser radiation is greater than the intensity of the first pulse of laser radiation.

10. The method of claim 8, wherein the first pulse of laser radiation is incident upon the droplet of target material before the second pulse of laser radiation.

11. A lithographic apparatus comprising:
a radiation system comprising
a target material supply configured to supply droplets of target material along a trajectory; and
a laser system comprising an amplifier and optics,
the optics being configured to establish a first beam path which passes through the amplifier and through a preconditioning position on the trajectory at which the droplets of target material are heated, and to establish a second beam path which passes through the amplifier and through a plasma formation position on the trajectory at which the droplets of target material form an EUV radiation emitting plasma,
the laser system being configured to generate a first pulse of laser radiation when photons emitted from the amplifier are reflected along the first beam path by a droplet of target material at the preconditioning position on the trajectory, and to generate a second pulse of laser radiation when photons emitted from the amplifier are reflected along the second beam path by the droplet of target material at the plasma formation position on the trajectory;
an illumination system configured to condition EUV radiation emitted by the radiation system;
a support structure constructed to hold a patterning device, the patterning device being configured to impart the radiation beam with a pattern in its cross-section to form a patterned radiation beam;
a substrate table constructed to hold a substrate; and
a projection system configured to project the patterned radiation beam onto a target portion of the substrate.

12. A radiation system comprising:
a target material supply configured to supply droplets of target material along a trajectory;
a secondary radiation beam generator configured to generate a secondary radiation beam directed to a preconditioning position on the trajectory at which the droplets target material are heated;
a primary radiation beam generator configured to generate a primary radiation beam directed to a plasma formation position on the trajectory at which the droplets of target material form an EUV radiation emitting plasma; and
a collector mirror configured to collect and redirect radiation generated at the plasma formation position to an intermediate focus,
wherein debris generated at the preconditioning position is redirected by the collector mirror to a location that is spaced from the intermediate focus.

* * * * *